(12) United States Patent
Jeddeloh

(10) Patent No.: US 6,754,117 B2
(45) Date of Patent: Jun. 22, 2004

(54) SYSTEM AND METHOD FOR SELF-TESTING AND REPAIR OF MEMORY MODULES

(75) Inventor: Joseph M. Jeddeloh, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 37 days.

(21) Appl. No.: 10/222,393

(22) Filed: Aug. 16, 2002

(65) Prior Publication Data

US 2004/0034825 A1 Feb. 19, 2004

(51) Int. Cl.$^7$ ................................................ G11C 7/00
(52) U.S. Cl. ........................................ 365/201; 365/200
(58) Field of Search ................................ 365/201, 200; 714/710, 711

(56) References Cited

U.S. PATENT DOCUMENTS

| | | | |
|---|---|---|---|
| 5,818,844 A | 10/1998 | Singh et al. ................ 370/463 |
| 5,875,352 A | 2/1999 | Gentry et al. ............... 395/843 |
| 6,067,262 A * | 5/2000 | Irrinki et al. ................ 365/201 |
| 6,246,618 B1 * | 6/2001 | Yamamoto et al. ......... 365/200 |
| 6,272,609 B1 | 8/2001 | Jeddeloh ..................... 711/169 |
| 6,301,637 B1 | 10/2001 | Krull et al. .................. 711/112 |
| 6,421,744 B1 | 7/2002 | Morrison et al. ............ 710/22 |
| 6,434,639 B1 | 8/2002 | Haghighi ..................... 710/39 |
| 6,463,059 B1 | 10/2002 | Movshovich et al. ....... 370/389 |
| 6,470,422 B2 | 10/2002 | Cai et al. ..................... 711/129 |
| 6,473,828 B1 | 10/2002 | Matsui ........................ 711/104 |
| 6,477,592 B1 | 11/2002 | Chen et al. .................. 710/52 |
| 6,477,614 B1 | 11/2002 | Leddige et al. ................ 711/5 |
| 6,477,621 B1 | 11/2002 | Lee et al. .................... 711/120 |
| 6,496,909 B1 | 12/2002 | Schimmel .................... 711/163 |
| 6,505,287 B2 | 1/2003 | Uematsu ...................... 711/170 |
| 6,523,092 B1 | 2/2003 | Fanning ....................... 711/134 |
| 6,523,093 B1 | 2/2003 | Bogin et al. ................. 711/137 |
| 6,539,490 B1 | 3/2003 | Forbes et al. ................ 713/401 |
| 6,552,564 B1 | 4/2003 | Forbes et al. ................ 326/30 |
| 6,587,912 B2 | 7/2003 | Leddige et al. ................ 711/5 |
| 6,590,816 B2 * | 7/2003 | Perner ......................... 365/200 |
| 6,594,713 B1 | 7/2003 | Fuoco et al. ................. 710/31 |
| 6,622,227 B2 | 9/2003 | Zumkehr et al. ............ 711/167 |
| 6,631,440 B2 | 10/2003 | Jenne et al. .................. 711/105 |
| 2002/0112119 A1 | 8/2002 | Halbert et al. ............... 711/115 |
| 2002/0144064 A1 | 10/2002 | Fanning ....................... 711/144 |
| 2003/0005223 A1 | 1/2003 | Coulson et al. ............. 711/118 |
| 2003/0043426 A1 | 3/2003 | Baker et al. ................. 359/109 |
| 2003/0229770 A1 | 12/2003 | Jeddeloh ...................... 711/213 |

OTHER PUBLICATIONS

Micron Technology, Inc., Synchronous DRAM Module 512MB/1GB (x72, ECC) 168–PIN Registered FBGA SDRAM DIMM, Micron Technology, Inc., 2002, pp. 1–23.

Intel, *Intel 840 Chipset: 82840 Memory Controller Hub (MCH)*, Oct. 1999, Order No. 298020–001, entirity.

* cited by examiner

Primary Examiner—Anh Phung
(74) Attorney, Agent, or Firm—Dorsey & Whitney, Inc.

(57) ABSTRACT

A computer system and a method used to test and repair defective memory portions of memory devices located on a memory module. The computer system includes a memory hub controller coupled to a plurality of memory modules each of which includes a memory hub and a plurality of memory devices. The memory hub comprises a self-test module that determines the locations of defective memory locations of the memory devices. A repair module also included in the memory hub uses the locations of defective memory portions to create a remapping table. The remapping table redirects accesses to the defective locations of the memory devices to non-defective memory locations. Each time the memory hub receives a memory request from a memory access device, the memory hub checks the memory location to which the access is directed, and, if necessary, redirects the memory access to a non-defective location.

55 Claims, 3 Drawing Sheets

SYSTEM AND METHOD FOR SELF-TESTING AND REPAIR OF MEMORY MODULES

TECHNICAL FIELD

The present invention relates to a computer system, and more particularly, to a computer system having a memory module with a memory hub coupling several memory devices to a processor or other memory access devices.

BACKGROUND OF THE INVENTION

Computer systems use memory devices, such as dynamic random access memory ("DRAM") devices, to store instructions and data that are accessed by a processor. These memory devices are normally used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data is transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively slow speed of memory controllers and memory devices limits the data bandwidth between the processor and the memory devices.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices.

One approach to alleviating the memory latency problem is to use multiple memory devices coupled to the processor through a memory hub. In a memory hub architecture, a system controller or memory hub controller is coupled to several memory modules, each of which includes a memory hub coupled to several memory devices. The memory hub efficiently routes memory requests and responses between the controller and the memory devices. Computer systems employing this architecture can have a higher bandwidth because a processor can access one memory device while another memory device is responding to a prior memory access. For example, the processor can output write data to one of the memory devices in the system while another memory device in the system is preparing to provide read data to the processor. The operating efficiency of computer systems using a memory hub architecture can make it more practical to vastly increase memory capacity in computer systems.

Despite the advantages of utilizing a memory hub for accessing memory devices, the semiconductor technology used by memory devices often results in defective memory locations, which make the memory devices unreliable. The degree to which defective locations in a memory device impairs the performance of a computer system using such a device depends on the nature of the computer system and the application it is performing. Computer systems may vary from simple computers, such as those contained in telephone answering machines, to highly complex supercomputers employed for complicated scientific projects. In simple computers used for telephone answering machines, for example, errors in one or more of the memory locations of the memory may not be fatal. For example, a mistake in the memory of the telephone answering machine likely would only cause the synthesized voice stored on the memory to be imperceptibly altered. However, one or more defective memory locations in the memory of a computer used to perform scientific calculations may cause substantial problems.

Although current manufacturing techniques have substantially reduced the number of defective memory locations, computer memory is still susceptible to such defective memory locations. Those defective memory locations can be caused by any of numerous steps taken during manufacture of the memory chips, semiconductor crystalinity defects, electrical connector discontinuities, etc. Although memory chips with such defective memory locations typically represent a small portion (less than 1%) of the total number of memory chips produced, the actual number of such defective memory chips is substantial.

In the past, extra rows of memory cells, known as "redundant rows" were provided to replace rows having defective memory cells. While the use of redundant rows is successful in salvaging otherwise defective memory chips, the number of defective rows that can be replaced is limited to the number of redundant rows that are provided on the memory chip. The number of defective rows sometimes exceeds the number of available redundant rows, thus preventing repair of some defective rows. In some cases, such defective memory chips could be sold at a greatly reduced price for applications that do not require perfect memory, such as for telephone answering machines. However, it could be beneficial if some of those memory chips could be employed in more critical applications, such as in personal computers.

One way to enable such defective memory chips to be incorporated into personal computers is to employ error correction schemes to compensate for defective memory locations. Error correction schemes add to each data word plural error correction bits that enable the data word to be reconstituted in the event of an erroneous data bit within the data word. However, such prior art error correction schemes typically only reconstitute a data word if only a single bit of the data word is erroneous. Moreover, such error correction schemes add several extra data bits to each data word which results in high memory overhead. In addition, such error correction schemes could be extended to detect multiple erroneous data bits, but the memory overhead that would result likely would be unacceptable.

Another method of correcting defective memory bits is through a commonly known remapping scheme. Remapping schemes utilize a predefined error map and remapping table to redirect defective memory locations. The error map is usually created in the factory based on well-known tests that determine which memory locations of the memory block are defective. Although these remapping schemes address double bit error problems and high memory overhead, they present various downfalls. For example, creating the error map at the factory does not allow future defective locations to be corrected and adds additional time and money to the manufacturing process. Creating the error map in the system controller requires each computer manufacturer to develop unique testing systems for each type of memory device accessed by the computer system.

Regardless of the type of memory repair or correction technique that is used, it is generally necessary to detect the location of defective memory cells. Defective memory cells are commonly detected by writing a pattern of known data, such as a checkerboard pattern of 1s and 0s, to an array of memory cells, and then reading data from the memory cells to determine if the read data match the write data. Testing memory devices in this manner is normally performed at several stages during the manufacture of the memory devices and by a computer or other system using the memory devices. For example, a computer system normally tests system memory devices, which are normally dynamic random access ("DRAM") memory devices, at power-up of the computer system.

The time required to test memory devices by writing known data to the memory devices, reading data from the memory devices, and comparing the read data to the write data is largely a function of the storage capacity of the memory devices. For example, doubling the number of memory cells in a memory device normally doubles the time to test the memory device. While the time required to test memory devices used in conventional memory architectures may be acceptably short, the time required to test memory devices using other architectures can be unacceptably long. For example, the vast memory capacity that a memory hub architecture can provide can result in an unacceptably long period of time for a processor to test the memory devices in the memory hub architecture system.

One approach to decreasing the time required to test memory devices by comparing read data to write data is to move the memory testing function "on chip" by incorporating self-test circuits in memory devices. Although this approach can reduce the time required to test memory devices, the pass/fail status of each memory device must nevertheless be reported to a processor or other memory access device. In a memory hub architecture using a large number of memory devices, it may require a substantial period of time for all of the memory devices to report their pass/fail status.

There is therefore a need for memory module that combines the advantages of a memory hub architecture with the advantages of testing and repairing memory devices on the memory module.

SUMMARY OF THE INVENTION

The present invention is directed to a computer system and method for testing and repairing defective memory locations of memory devices located on a memory module. The computer system includes a plurality of memory modules coupled to a memory hub controller. Each of the memory modules includes a plurality of memory devices and a memory hub. The memory hub comprises a self-test module and a repair module. The self-test module is coupled to the memory devices, and in response to a request to test the memory devices, the self-test module executes one or more self-test routines. The self-test routines determine the locations of defective memory on the memory devices. The repair module uses the locations of defective memory to create a remapping table. The remapping table redirects the defective memory locations of the memory devices to non-defective memory locations of memory located on the memory module, such as in the memory devices, or in cache memory or scratch memory located within the memory hub. Thus, each time the memory hub receives a memory request from one of the memory access devices, such as the computer processor, the memory hub utilizes the repair module to check the memory location for defective memory and if necessary, redirect the memory request to a non-defective location.

As will be apparent, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE INVENTION

Figure 1:
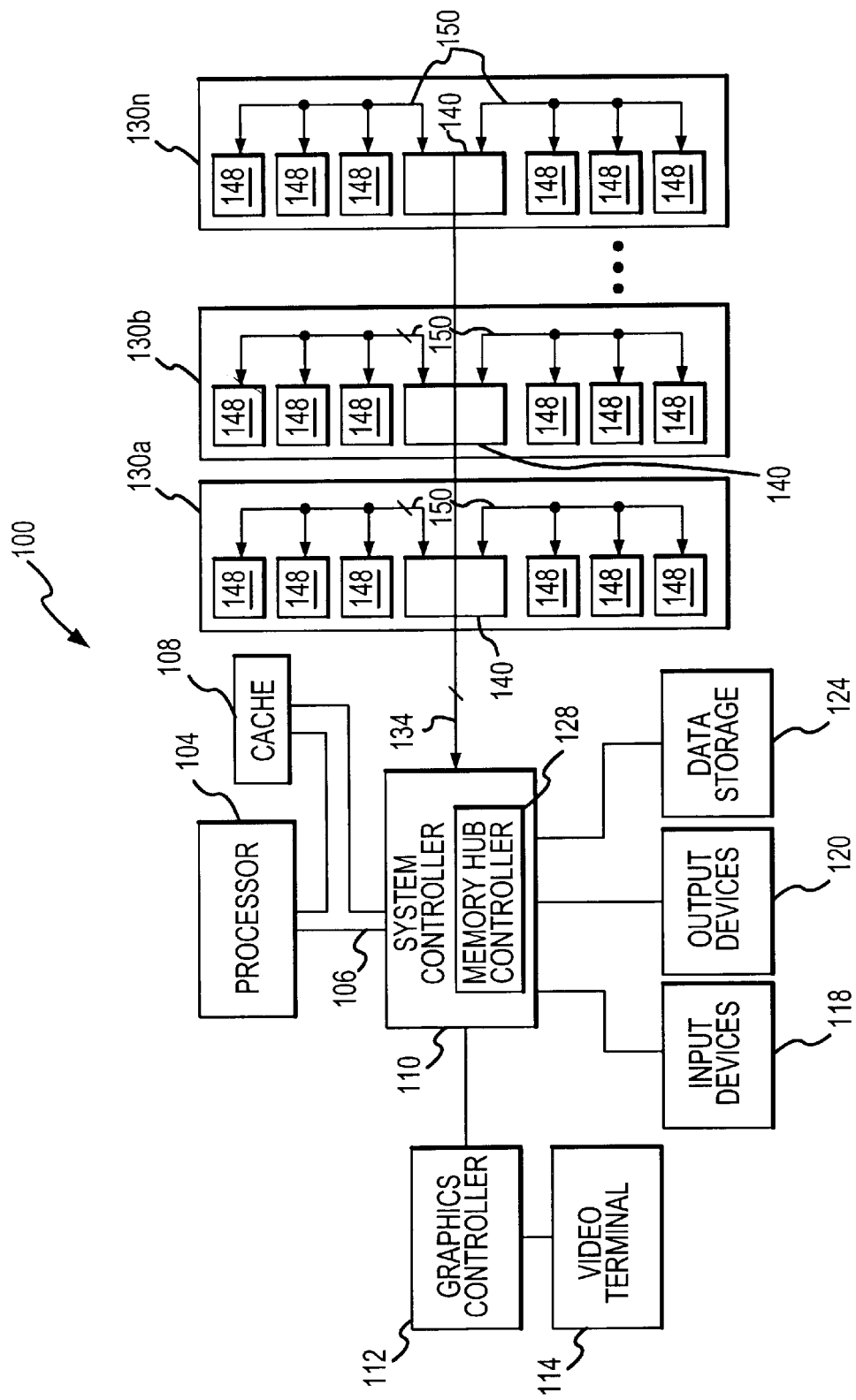
FIG. 1 is a block diagram of a computer system according to one example of the invention in which a memory hub is included in each of a plurality of memory modules.

A computer system 100 according to one embodiment of the invention is shown in FIG. 1. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a "North Bridge" or "memory controller."

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory hub controller 128 that is coupled to several memory modules 130a,b . . . n, which serve as system memory for the computer system 100. The memory modules 130 are preferably coupled to the memory hub controller 128 through a high-speed link 134, which may be an optical or electrical communication path or some other type of communications path. In the event the high-speed link 134 is implemented as an optical communication path, the optical communication path may be in the form of one or more optical fibers. In such case, the memory hub controller 128 and the memory modules will include an optical input/output port or separate input and output ports coupled to the optical communication path. The memory modules 130 are shown coupled to the memory hub controller 128 in a multi-drop arrangement in which the single high-speed link 134 is coupled to all of the memory modules 130. However, it will be understood that other topologies may also be used, such as a point-to-point coupling arrangement in which a separate high-speed link (not shown) is used to couple each of the memory modules 130 to the memory hub controller 128. A switching topology may also be used in which the memory hub controller 128 is selectively coupled to each of the memory modules 130 through a switch (not shown). Other topologies that may be used will be apparent to one skilled in the art.

Each of the memory modules 130 includes a memory hub 140 for controlling access to six memory devices 148, which, in the example illustrated in FIG. 1, are synchronous dynamic random access memory ("SDRAM") devices. However, a fewer or greater number of memory devices 148 may be used, and memory devices other than SDRAM devices may also be used. The memory hub 140 is coupled to each of the system memory devices 148 through a bus system 150, which normally includes a control bus, an address bus, and a data bus.

Figure 2:
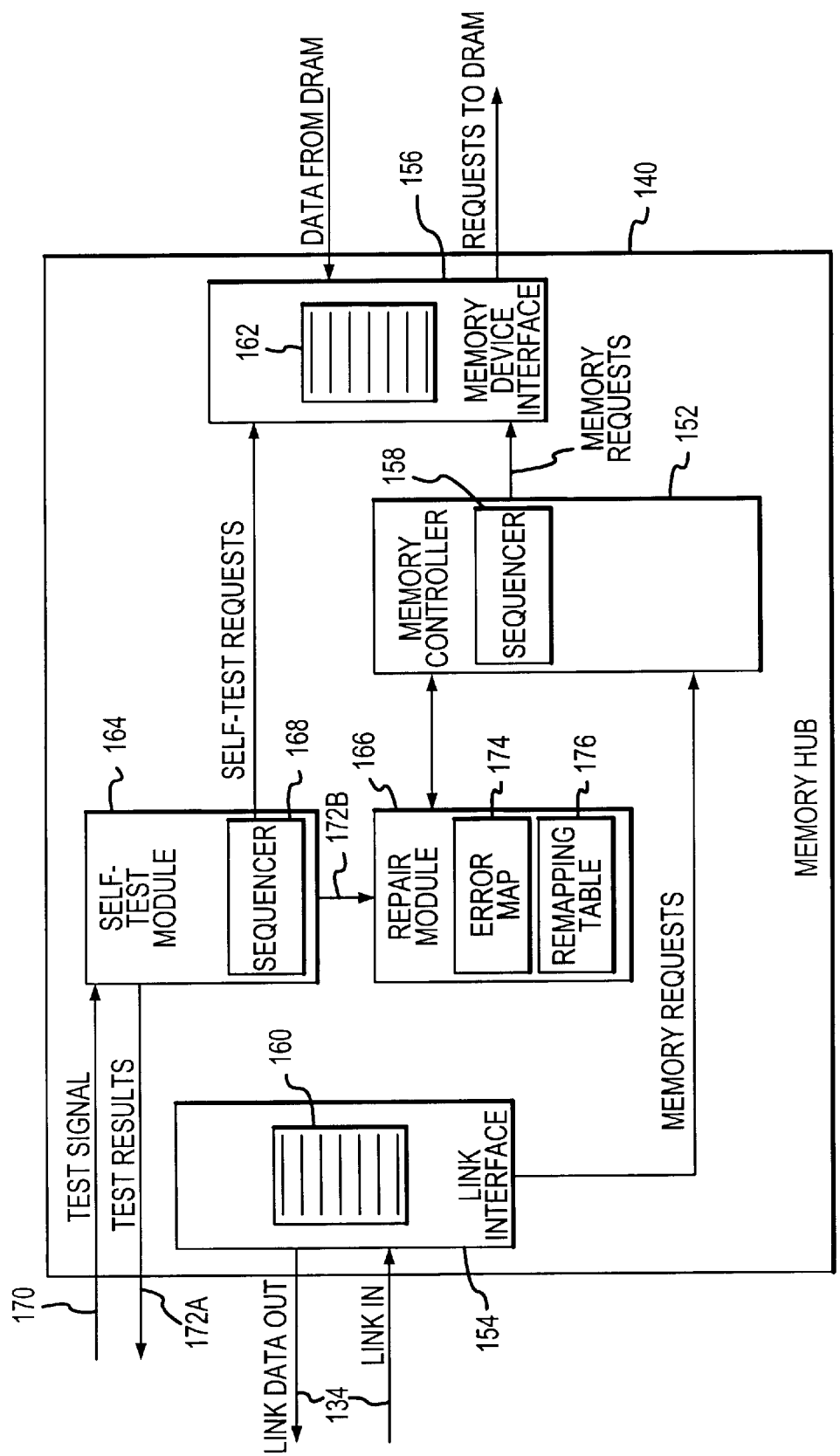
FIG. 2 is a block diagram of one example of a memory module used in the computer system of FIG. 1.

One example of the memory hub 140 that can be used in the memory module 130 of FIG. 1 is shown in FIG. 2. The memory hub 140 preferably includes, but is not limited to, a memory controller 152, a link interface 154, and a memory device interface 156. The link interface 154 is coupled to the high-speed link 134 for receiving address, command, and write data signals from the memory hub controller 128 (FIG. 1) and for transmitting read data signals to the memory hub controller 128. The nature of the link interface 154 will depend upon the characteristics of the high-speed link 134. For example, in the event the high-speed link 134 is implemented using an optical communications path, the link interface 154 will include an optical input/output port and will convert optical signals coupled through the optical communications path into electrical signals. In any case, the link interface 154 preferably includes a buffer, such as a first-in, first-out buffer 160, for receiving and storing memory requests as they are received through the high-speed link 134. The memory requests are stored in the buffer 160 until they can be processed by the memory hub 140.

When the memory hub 140 is able to process a memory request, one of the memory requests stored in the buffer 160 is transferred to the memory controller 152. The memory controller 152 may include a sequencer 158 that converts memory requests from the format output from the memory hub controller 128 into memory requests having a format that can be used by the memory devices 148. These re-formatted request signals will normally include memory command signals, which are derived from memory commands contained in the memory requests, and row and column address signals, which are derived from an address contained in the memory requests. In the event one of the memory requests is a write memory request, the re-formatted request signals will normally include write data signals which are derived from write data contained in the memory request received by the memory hub 140. For example, where the memory devices 148 are conventional DRAM devices, the memory sequencer 158 will output row address signals, a row address strobe ("RAS") signal, an active high write/active low read signal ("W/R*"), column address signals and a column address strobe ("CAS") signal.

The sequencer 158 applies the signals of the re-formatted memory requests to the memory device interface 156 in the sequence required by the memory devices 148. The nature of the memory device interface 156 will depend upon the characteristics of the memory devices 148. For example, the sequencer 158 may apply to the memory device interface 156 row address signals, followed by a RAS signal, followed by column address signals, followed by a CAS signal. In any case, the memory device interface 156 preferably includes a buffer, such a first in, first out (FIFO) buffer 162, for receiving and storing one or more memory requests as they are received from the sequencer 158. The memory requests are stored in the buffer 162 until they can be processed by the memory devices 148. In the event the memory device interface 156 stores several memory requests, the memory device interface 156 may reorder the memory requests so that they are applied to the memory devices 148 in some other order.

The memory requests are described above as being received by the memory hub 140 in a format that is different from the format that the memory requests are applied to the memory devices 148. However, the memory hub controller 128 may instead re-format the memory requests from the processor 104 to a format that can be used by the memory devices 148. The sequencer 158 would then simply schedule the re-formatted request signals in the order needed for use by the memory devices 148. The memory request signals for one or more memory requests are then transferred to the memory device interface 156 so they can subsequently be applied to the memory devices 148.

With further reference to FIG. 2, the memory hub 140 further includes a self-test module 164 and a repair module 166. The self-test module 164 includes a sequencer 168, and the repair module 166 includes an error map 174 and a remapping table 176. Although not shown, the memory module 140 may also include other components, as described above, for interfacing with the memory hub controller 128 and memory devices 148.

As previously explained, one of the problems with memory modules is the presence of defective memory. To ensure the reliability of memory modules, additional time and money is spent testing and/or repairing each module at either the factory or on-board the computer. However, testing and repairing the memory at the factory does not resolve any future memory defects that may develop. Likewise, testing the memory on board the computer requires time for the computer to execute a test routine each time power is applied to the computer. For a computer system using memory having a memory hub architecture, the time required to test memory devices during each power-up can be unacceptably long. Furthermore, testing memory devices after they have been installed in a computer system only identifies the existence of memory defects. It is generally not possible to do anything about these defects, such as by using the techniques described above to repair such defects.

The memory module 130 shown in FIG. 2 provides a self-test and repair capability that is integrated into the memory module 130. Thus, the memory module 130 can continuously test and repair itself after it is installed in the computer system 100 or other system. The test and repair system is an integral part of the memory module 130 and is designed specifically for the type of memory devices 148 incorporated into the memory module 130. This eliminates the need for each computer manufacturer to develop custom testing and repair systems for each type of memory device 148 utilized by its computer system. In addition, by locating the self-test module 164 and repair module 166 on the memory hub 140, the memory module 130 takes advantage of the memory handling capabilities of the memory hub 140, such as the memory hub's ability to efficiently route memory requests and responses between the memory hub controller 128 and the memory devices 148. This allows the memory module 130 to more consistently and quickly test and repair itself.

The self-test module 164 shown in FIG. 2 provides a self-testing system that directly accesses memory devices 148 through the sequencer 168. The self-test module 164 may execute a number of built-in-self-test (BIST) routines (not shown) for exercising the memory devices 148 of the memory module 130. The self-test routines may be executed with either logic circuitry or a programmed processor. The self-test routines may be stored in the self-test module 164 or may be stored in non-volatile memory on the memory module 130 or elsewhere and then loaded into the self-test module 164 as needed. The self-test routines execute a series of memory device tests and identify defective memory locations. For example, one routine may write data to a memory location of the memory devices 148 and then attempt to read the data from the memory devices 148. If the data read from the memory location does not match the data written to the memory location, then the memory location is determined to be defective. The self-test routines may test every memory location to determine whether it is defective, and if so, an error tag is created for the defective memory location. In the alternative, the self-test routine may test larger memory locations, such as four kilobyte groups of memory locations, to determine whether the four kilobyte memory locations are defective.

In the embodiment shown in FIG. 2, the sequencer 168 is built into the self-test module 164. The sequencer 168 allows the self-test module 164 to access each memory device 148 through the memory device interface 156. The self-test routines of the self-test module 164 are carried out by sending a series of memory requests to the sequencer 168. The sequencer 168 converts the memory requests from the format output from the self-test module 164 into a memory request having a format that can be used by the memory devices 148. The sequencer 168 applies the re-formatted memory requests to the memory device interface 156.

The self-test routines of self-test module 164 can be initiated in a number of ways. As shown in FIG. 2, a test signal 170 is coupled to the self-test module 164 to initiate the testing procedures of the self-test module 164. This signal may be provided each time the computer system 100 is turned on, such that testing procedures are always run upon power up of the computer system. A power-up detect circuit (not shown) may also be located on the memory module 130, such that each time the computer system 100 is turned on, the power-up detect circuit detects power-up and initiates the self-test routines of the self-test module 164. In addition, the self-test routines may be initiated from the processor 104 supplying the test signal 170 or from the high-speed link 134. More specifically, the high-speed link 134 can be used to provide a signal that initiates the self-test routines of the self-test module 116. Initiating the testing procedures can be done in other ways commonly understood in the art and are not limited to those described herein.

The results of the memory tests are used to identify and preferably repair the defective memory locations of the memory devices 148. The results may be reported directly to the processor 104 or other memory access devices of computer system 100. As shown in FIG. 2, the results may be sent via either a test results link 172A or the link data out 134. This allows each memory access device to individually handle the defective memory locations. However, the results are preferably used on-board the memory hub 140 by the repair module 166. As shown in FIG. 2, the results are sent to repair module 166 via a test results link 172B.

Identification of the defective memory locations of memory devices 148 are combined and stored in the error map 174. The error map 174 may be created by self-test module 164 and then transferred to repair module 166, or in the alternative, the results of the self-test routines may be transferred to the repair module 166 so that the error map 174 can be created by repair module 166. In preferred embodiments, the error map 174 is stored on repair module 166, but the error map 174 may also be stored by and accessed from self-test module 164 or stored in other locations, such as by the memory hub 140 or the memory devices 148. The type of memory used to store error map 174 is typically nonvolatile memory. Because access to nonvolatile memory is typically slower than access to volatile memory, the error map 174 may be stored in nonvolatile memory and then transferred into volatile memory for faster access by repair module 166.

The error map 174 includes an error tag for each of the defective volatile memory locations of the memory devices 148. Preferably, the error map 174 is implemented by associating an error tag with each defective volatile memory portion and a non-error tag for each non-defective volatile memory portion. For example, the error tag may be a tag bit of a first logic value, such as 0, if the memory portion is defective and the non-error tag may be a tag bit of a second logic value, such as 1, if the memory portion is not defective. Alternatively, the error map 174 may simply include the addresses of the defective memory locations such that the addresses not listed are assumed to be non-defective.

The repair module 166 uses memory located on the memory module 130 to remap defective memory locations of memory devices 148. Once the error map 174 has been created, the repair module 164 creates the remapping table 176. The remapping table 176 redirects each of the defective memory locations of memory devices 148 to a portion of the memory devices 148 that is known to be non-defective. In other words, for each defective portion of the memory devices 148, the remapping table 176 includes an index that points to a non-defective portion of the memory devices 148. The locations to which the defective memory locations are being mapped preferably are located in a reserved region of the memory devices 148 of the memory module 130, such that they cannot be directly accessed by the processor 104. By protecting the reserved memory region from direct access by the processor 104, the computer system 100 prevents memory access conflicts that would occur if the processor 104 could overwrite the locations that are occupied by the memory locations to which the defective locations are mapped. The remapping table 176 can redirect defective memory locations to other non-defective locations on the memory module 130, including cache memory and scratch memory located on the memory hub 140.

As with error map 174, the remapping table 176 may be stored in a number of memory locations. If the remapping table is recreated each time the computer system 100 is powered on, the remapping table may be located in the memory devices 148. However, the remapping table 176 may also be stored in nonvolatile memory. For example, if the remapping table 176 is only created periodically, it is preferable to store the remapping table 176 in nonvolatile memory. When the remapping table 176 is stored in nonvolatile memory, the access time to the remapping table 176 may be increased by transferring the table 176 to volatile memory. As shown in FIG. 2, remapping table 176 is stored in memory located on the repair module 166, but it is not limited to this location. The remapping table 176 may also be located in other memory on the memory hub 140. The remapping table is preferably located in the memory devices 148 because the amount of memory available in the repair module 166 or memory hub 140 may be limited while much more space is likely to be available in the memory devices 148. If the remapping table 176 is stored in memory devices 148, it is preferably stored in a reserved memory region.

After the error map 174 and the remapping table 176 are stored in the appropriate locations in memory, the memory module 130 is ready to receive memory requests for access to the memory devices 148. The link interface 154 of the memory hub 140 receives each memory request from the memory hub controller 128 for access to one or more addressed locations of the memory devices 148. The link interface 154 couples the memory request to the memory controller 152 of the memory hub 140. The memory controller 152 responds by accessing the repair module 164 to determine from the error map 176 whether the addressed location of the memory request is defective. If the error map 176 indicates that the addressed memory location is not defective, then the memory controller 152 simply couples the memory request to the addressed location of the memory devices 148 via the memory device interface 156. If the error map 176 indicates that the addressed memory location is defective, then memory repair module 164 accesses the remapping table 176. The memory controller 152 then couples the memory request to the non-defective memory location determined from the remapping table 176 and couples the memory request to the memory devices 148 via the memory device interface 156. The memory device interface 156 then performs the function requested by the memory request. For example, if the memory access request was a request to read data from the addressed memory location, then the memory device interface 156 reads the data from the non-defective memory location to which the addressed memory location is mapped and the memory hub 140 returns the data to the memory hub controller 128 via the high-speed link 134.

Figure 3:
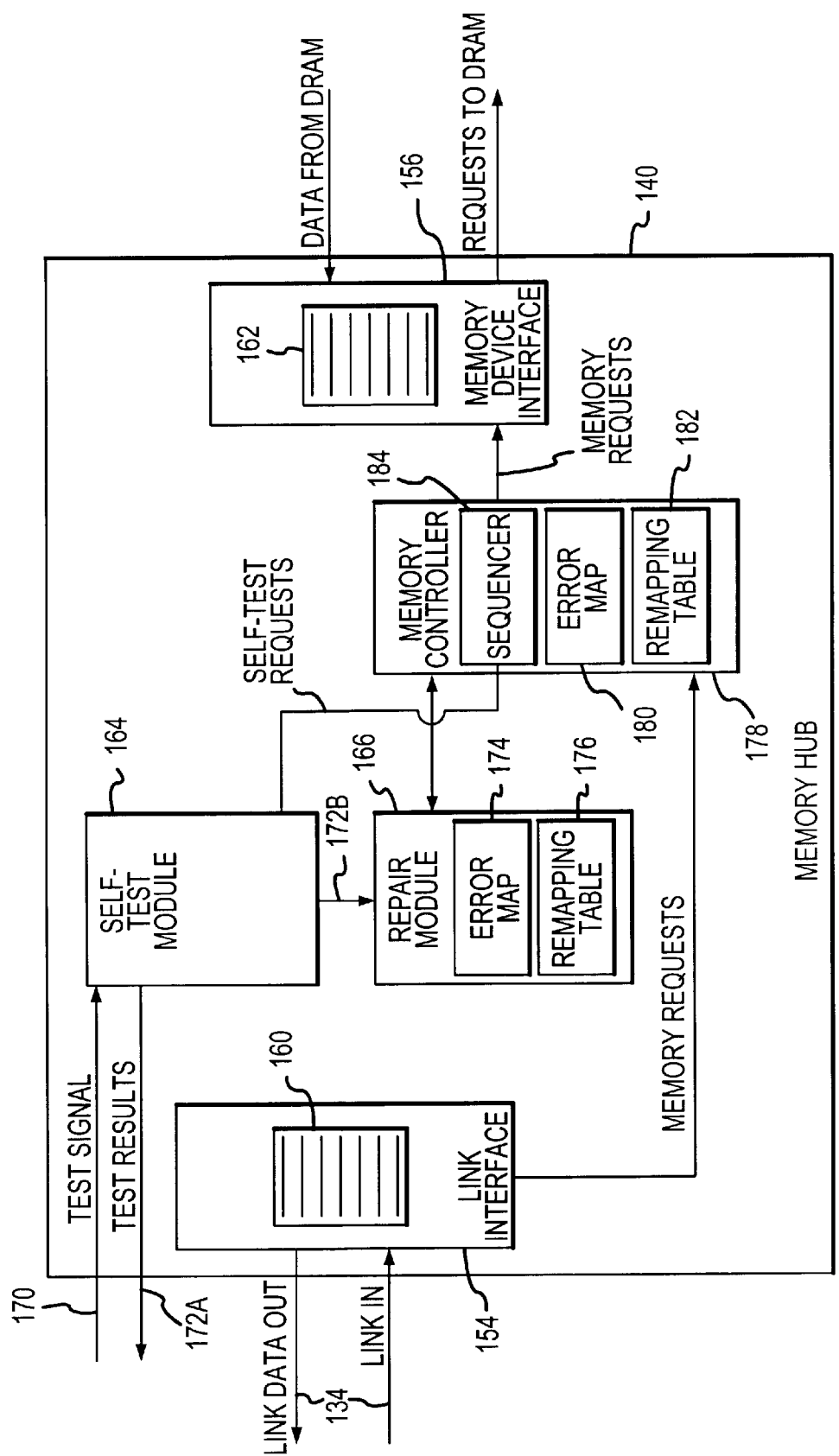
FIG. 3 is a block diagram of one example of a memory hub used in the memory module of FIG. 2.

FIG. 3 shows a second embodiment of the memory hub 140 of FIG. 1. In this embodiment, the memory hub 140 includes the self-test module 164 and the repair module 166 of FIG. 2. The repair module 166 again includes the error map 174 and the remapping table 176. In the interest of brevity, such common components have been provided with the same reference numerals, and an explanation of their operation will not be repeated.

The memory hub 140 in FIG. 3 differs from the memory hub 140 shown in FIG. 2 in that it uses a memory controller 178 that includes an error map 180 that is a copy of the error map 174 and a remapping table 182 that is a copy of the remapping table 176. The memory hub 140 in FIG. 3 also differs from the memory hub 140 shown in FIG. 2 in that the memory controller 178 includes a sequencer 184 and the self-test module 164 does not include the sequencer 168 used in the embodiment of FIG. 2. As a result, the self test module 164 does not directly access memory devices 148 from the on-board sequencer 168 of FIG. 2, but instead access the memory devices 148 through the sequencer 184 now located on the memory controller 178. By placing the error map 180 and the remapping table 182 in the memory controller 178, the memory controller 178 is able to identify and repair defective memory locations without having to access the repair module 164 for each memory request. By using the sequencer 184 in the memory controller 178 to access the memory devices 148, the memory hub 140 of FIG. 3 can utilize the existing capabilities of the memory controller 178 to access the memory devices 148.

Preferably, the memory controller 178 transfers the error map 174 and the remapping table 176 to the memory controller 178 each time a new map 174 and table 176 are created. Another option is to place the repair module 164 on memory controller 178 such that error map 174 and remapping table 176 can be directly accessed without having to be transferred to the error map 180 and the remapping table 182, respectively. Configurations of the components of the memory hub 140 that are different from the configurations used in the embodiments shown in FIGS. 2 and 3 may also be used.

The entire process of testing and repairing defective memory locations of memory devices 148 is transparent to the memory hub controller 128, or more specifically the processor 104 and other memory access devices. As a result, there is no need for the software being run by the processor 104 or the functionality of the memory hub controller 128 to be modified in any way to operate in conjunction with the memory devices 148 of memory module 130. Thus, the memory hub controller 128 need not test the memory devices 148 or repair defective memory locations, but can instead communicate with memory hub 140 in a conventional manner.

Although the present invention has been described with reference to preferred embodiments, persons skilled in the art will recognize that changes may be made in form and detail without departing from the spirit and scope of the invention. Accordingly, the invention is not limited except as by the appended claims.

What is claimed is:

1. A memory module, comprising:
   a plurality of memory devices; and
   a memory hub, comprising:
      a self-test module coupled to at least one of the memory devices, the self-test module being responsive to a request to test at least one of the memory devices, the self-test module further being operable to identify defective memory locations of the memory devices; and
      a repair module coupled to the self-test module and at least one of the memory devices, the repair module being responsive to memory requests to defective memory locations of the memory devices to redirect the memory requests to non-defective memory locations of the memory devices.

2. The memory module of claim 1 wherein the self-test module further comprises a sequencer for accessing the memory devices, the sequencer being operable to output an address, contained in memory requests from the self-test module, for accessing memory locations of the memory devices.

3. The memory module of claim 1 wherein the memory module further comprises:
   a link interface for receiving memory requests to at least one of the memory devices;
   a memory device interface coupled to the memory devices, the memory device interface being operable to couple memory requests to the memory devices; and a memory controller coupled to the link interface and the memory device interface and the repair module, the memory controller being operable to generate and couple memory requests from the link interface to the memory device interface by utilizing the repair module to redirect memory requests to defective locations of the memory devices to non-defective locations of the memory devices.

4. The memory module of claim 3 wherein the memory controller further comprises a sequencer for accessing the memory devices, the sequencer being operable to output an address, contained in memory requests from the self-test routines, for accessing memory locations of the memory devices.

5. The memory module of claim 3 wherein the memory device interface further comprises a first-in, first-out buffer that is operable to receive and to store memory requests received from the memory controller and to transfer the stored memory requests to at least one of the memory devices in the order in which they were received.

6. The memory module of claim 3 wherein the link interface comprises a first-in, first-out buffer that is operable to receive and store memory requests and to transfer the stored memory requests to the memory controller in the order in which they were received.

7. The memory module of claim 1 wherein information identifying the defective memory locations of the memory devices is transferred from the self-test module to the repair module.

8. The memory module of claim 1 wherein the self-test module is coupled to at least one of the memory access devices, the locations of the defective memory of the memory devices being transferred to at least one of the memory access device.

9. The memory module of claim 1 wherein the repair module further comprises an error map that stores the locations of the defective memory of the memory devices, the repair module utilizing the error map to determine whether the memory requests are to defective memory locations of the memory devices.

10. The memory module of claim 9 wherein the repair module further comprises a remapping table that uses the error map to assign the defective memory locations of the memory devices to non-defective memory locations of memory located on the memory module, the repair module using the remapping table to redirect memory requests to defective memory locations of the memory devices to non-defective memory locations of the memory devices.

11. The memory module of claim 1 wherein the memory devices comprise dynamic random access memory devices.

12. A memory module, comprising:
a plurality of memory devices; and
a memory hub, comprising:
a memory controller coupled to at least one of the memory devices, the memory controller being responsive to memory requests to the memory devices;
a self-test module coupled to the memory controller, the self-test module being responsive to a request to test at least one of the memory devices, the self-test module further being operable to identify defective memory locations of the memory devices; and
a repair module coupled to the memory controller, the repair module being responsive to memory requests to defective memory locations of the memory devices to redirect the memory requests to non-defective memory locations of the memory devices.

13. The memory module of claim 12 wherein the memory controller further comprises a sequencer for accessing the memory devices, the sequencer being operable to output an address, contained in memory requests from the self-test module, for accessing memory locations of the memory devices.

14. The memory module of claim 12 wherein the memory module further comprises:
a link interface coupled to the memory controller for receiving memory requests to at least one of the memory devices; and
a memory device interface coupled to the memory controller and the memory devices, the memory device interface being operable to couple memory requests to the memory devices.

15. The memory module of claim 14 wherein the memory controller generates and couples memory requests from the link interface to the memory device interface by utilizing the repair module to redirect memory requests to defective locations of the memory devices to non-defective locations of the memory devices.

16. The memory module of claim 14 wherein the memory device interface further comprises a first-in, first-out buffer that is operable to receive and to store memory requests received from the memory controller and to transfer the stored memory requests to at least one of the memory devices in the order in which they were received.

17. The memory module of claim 14 wherein the link interface comprises a first-in, first-out buffer that is operable to receive and store memory requests and to transfer the stored memory requests to the memory controller in the order in which they were received.

18. The memory module of claim 12 wherein information identifying the defective memory locations of the memory devices is transferred from the self-test module to the repair module.

19. The memory module of claim 12 wherein the self-test module is coupled to at least one of the memory access devices, the locations of the defective memory of the memory devices being transferred to at least one of the memory access devices.

20. The memory module of claim 12 wherein the repair module further comprises an error map that stores the locations of the defective memory of the memory devices, the repair module utilizing the error map to determine whether the memory requests are to defective memory locations of the memory devices.

21. The memory module of claim 20 wherein the repair module further comprises a remapping table that uses the error map to assign the defective memory locations of the memory devices to non-defective memory locations of memory located on the memory module, the repair module using the remapping table to redirect memory requests to defective memory locations of the memory devices to non-defective memory locations of the memory devices.

22. The memory module of claim 21 wherein the memory controller further comprises the error map of the repair module, the error map being operable to determine whether the memory request is to a defective memory location of the memory devices.

23. The memory module of claim 22 wherein the memory controller further comprises the remapping table of the repair module, the remapping table being operable to redirect the memory requests to defective locations of the memory devices to non-defective locations of the memory devices.

24. The memory module of claim 12 wherein the memory devices comprise dynamic random access memory devices.

25. A computer system, comprising:
a central processing unit ("CPU");
a system controller coupled to the CPU, the system controller having an input port and an output port;
an input device coupled to the CPU through the system controller;
an output device coupled to the CPU through the system controller;
a storage device coupled to the CPU through the system controller;
a plurality of memory modules, each of the memory modules comprising:
  a plurality of memory devices; and
  a memory hub, comprising:
    a self-test module coupled to at least one of the memory devices, the self-test module being responsive to a request to test at least one of the memory devices, the self-test module further being operable to identify defective memory locations of the memory devices;
    a repair module coupled to the self-test module and at least one of the memory devices, the repair module being responsive to memory requests to defective memory locations of the memory devices to redirect the memory requests to non-defective memory locations of the memory devices; and
    a communications link coupling the output port of the system controller to the input port of the memory hub in each of the memory modules, and coupling the input port of the system controller to the output port of the memory hub in each of the memory modules.

26. The computer system of claim 25 wherein the self-test module further comprises a sequencer for accessing the memory devices, the sequencer being operable to output an address, contained in memory requests from the self-test module, for accessing memory locations of the memory devices.

27. The computer system of claim 25 wherein the memory module further comprises:
  a link interface for receiving memory requests to at least one of the memory devices;
  a memory device interface coupled to the memory devices, the memory device interface being operable to couple memory requests to the memory devices; and
  a memory controller coupled to the link interface and the memory device interface and the repair module, the memory controller being operable to generate and couple memory requests from the link interface to the memory device interface by utilizing the repair module to redirect memory requests to defective locations of the memory devices to non-defective locations of the memory devices.

28. The computer system of claim 27 wherein the memory controller further comprises a sequencer for accessing the memory devices, the sequencer being operable to output an address, contained in memory requests from the self-test routines, for accessing memory locations of the memory devices.

29. The computer system of claim 27 wherein the memory device interface further comprises a first-in, first-out buffer that is operable to receive and store memory requests received from the memory controller and to transfer the stored memory requests to at least one of the memory devices in the order in which they were received.

30. The computer system of claim 27 wherein the link interface comprises a first-in, first-out buffer that is operable to receive and store memory requests and to transfer the stored memory requests to the memory controller in the order in which they were received.

31. The computer system of claim 25 wherein information identifying the defective memory locations of the memory devices is transferred from the self-test module to the repair module.

32. The computer system of claim 25 wherein the self-test module is coupled to at least one of the memory access devices, the locations of the defective memory of the memory devices being transferred to at least one of the memory access device.

33. The computer system of claim 25 wherein the repair module further comprises an error map that stores the locations of the defective memory of the memory devices, the repair module utilizing the error map to determine whether the memory requests are to defective memory locations of the memory devices.

34. The computer system of claim 33 wherein the repair module further comprises a remapping table that uses the error map to assign the defective memory locations of the memory devices to non-defective memory locations of memory located on the memory module, the repair module using the remapping table to redirect memory requests to defective memory locations of the memory devices to non-defective memory locations of the memory devices.

35. The computer system of claim 25 wherein the memory devices comprise dynamic random access memory devices.

36. The computer system of claim 25 wherein the input and output ports of the memory hub controller comprise a combined input/output port coupled to the communications link, and wherein the input and output ports of each of the memory hubs comprises a combined input/output port coupled to the communications link.

37. The computer system of claim 36 wherein the communications link comprises an optical communications link, wherein the input and output ports of the memory hub controller comprises an optical input/output port coupled to the optical communications link and wherein the input and output ports of each of the memory hubs comprises a respective optical input/output port coupled to the optical communications link.

38. A computer system, comprising:
a central processing unit ("CPU");
a system controller coupled to the CPU, the system controller having an input port and an output port;
an input device coupled to the CPU through the system controller;
an output device coupled to the CPU through the system controller;
a storage device coupled to the CPU through the system controller;
a plurality of memory modules, each of the memory modules comprising:
  a plurality of memory devices; and
  a memory hub, comprising:
    a memory controller coupled to at least one of the memory devices, the memory controller being responsive to memory requests to the memory devices;
    a self-test module coupled to the memory controller, the self-test module being responsive to a request to test at least one of the memory devices, the self-test module further being operable to identify defective memory locations of the memory devices; and a repair module coupled to the memory controller, the repair module being responsive to memory requests to defective memory locations of the memory devices to redirect the memory requests to non-defective memory locations of the memory devices;

a communications link coupling the output port of the system controller to the input port of the memory hub in each of the memory modules, and coupling the input port of the system controller to the output port of the memory hub in each of the memory modules.

39. The computer system of claim 38 wherein the memory controller further comprises a sequencer for accessing the memory devices, the sequencer being operable to output an address, contained in memory requests from the self-test module, for accessing memory locations of the memory devices.

40. The computer system of claim 38 wherein the memory module further comprises:

a link interface coupled to the memory controller for receiving memory requests to at least one of the memory devices; and a memory device interface coupled to the memory controller and the memory devices, the memory device interface being operable to couple memory requests to the memory devices.

41. The computer system of claim 40 wherein the memory controller generates and couples memory requests from the link interface to the memory device interface by utilizing the repair module to redirect memory requests to defective locations of the memory devices to non-defective locations of the memory devices.

42. The computer system of claim 40 wherein the memory device interface further comprises a first-in, first-out buffer that is operable to receive and to store memory requests received from the memory controller and to transfer the stored memory requests to at least one of the memory devices in the order in which they were received.

43. The computer system of claim 40 wherein the link interface comprises a first-in, first-out buffer that is operable to receive and store memory requests and to transfer the stored memory requests to the memory controller in the order in which they were received.

44. The computer system of claim 38 wherein information identifying the defective memory locations of the memory devices is transferred from the self-test module to the repair module.

45. The computer system of claim 38 wherein the self-test module is coupled to at least one of the memory access devices, the locations of the defective memory of the memory devices being transferred to at least one of the memory access devices.

46. The computer system of claim 38 wherein the repair module further comprises an error map that stores the locations of the defective memory of the memory devices, the repair module utilizing the error map to determine whether the memory requests are to defective memory locations of the memory devices.

47. The computer system of claim 46 wherein the repair module further comprises a remapping table that uses the error map to assign the defective memory locations of the memory devices to non-defective memory locations of memory located on the memory module, the repair module using the remapping table to redirect memory requests to defective memory locations of the memory devices to non-defective memory locations of the memory devices.

48. The computer system of claim 47 wherein the memory controller further comprises the error map of the repair module, the error map being operable to determine whether the memory request is to a defective memory location of the memory devices.

49. The computer system of claim 48 wherein the memory controller further comprises the remapping table of the repair module, the remapping table being operable to redirect the memory requests to defective locations of the memory devices to non-defective locations of the memory devices.

50. The computer system of claim 38 wherein the memory devices comprise dynamic random access memory devices.

51. The computer system of claim 38 wherein the input and output ports of the memory hub controller comprise a combined input/output port coupled to the communications link, and wherein the input and output ports of each of the memory hubs comprises a combined input/output port coupled to the communications link.

52. The computer system of claim 51 wherein the communications link comprises an optical communications link, wherein the input and output ports of the memory hub controller comprises an optical input/output port coupled to the optical communications link and wherein the input and output ports of each of the memory hubs comprises a respective optical input/output port coupled to the optical communications link.

53. A method of testing and repairing each of a plurality of memory devices on each of a plurality of memory modules each of which includes a memory hub, the method comprising:

using the memory hub in at least one of the memory modules to generate a self-test routine;

using a generated self-test routine to test at least one of the memory devices in the memory module to identify defective memory locations of the at least one memory device;

receiving a memory request at the memory hub to access at least one of the memory devices;

determining at the memory hub if the received memory request is directed to a memory location identified as being a defective memory location;

if the received memory request is directed to a memory location identified as being a defective memory location, redirecting the memory request to a non-defective location of memory on the memory module; and if the received memory request is directed to a memory location that was not identified as being a defective memory location, accessing the location in the at least one memory device to which the memory request was directed.

54. The method of claim 53 and further comprising storing information identifying the defective memory locations of the memory devices in an error map.

55. The method of claim 54, further comprising creating a remapping table from the error map that assigns the defective memory locations of the memory devices to non-defective memory locations of the memory devices, the remapping table being used to redirect the memory requests directed to the defective memory locations of the memory devices to non-defective memory locations of the memory devices.

* * * * *

UNITED STATES PATENT AND TRADEMARK OFFICE
CERTIFICATE OF CORRECTION

PATENT NO. : 6,754,117 B2
DATED : June 22, 2004
INVENTOR(S) : Joseph M. Jeddeloh It is certified that error appears in the above-identified patent and that said Letters Patent is hereby corrected as shown below:

Title page,
Item [56], References Cited, U.S.PATENT DOCUMENTS, should read:
-- 5,251,303    10/1993    Fogg, Jr., et al ..................... 395/275
5,432,907    7/1995    Picazo, Jr. et al ................... 395/200
5,442,770    8/1995    Barratt .............................. 395/403
5,497,476    3/1996    Oldfield et al ..................... 395/439
5,659,798    8/1997    Blumrich et al .................... 395/846
6,061,263    5/2000    Boaz et al ......................... 365/51
6,073,190    6/2000    Rooney ............................ 710/56
6,105,075    8/2000    Ghaffari ........................... 710/5
6,137,709    10/2000   Boaz et al ......................... 365/51
6,144,587    11/2000   Yoshida ........................... 365/189.05
6,167,465    12/2000   Parvin et al ....................... 710/22
6,167,486    12/2000   Lee et al .......................... 711/120
6,201,724 B1 3/2001    Ishizaki et al ..................... 365/49
6,233,376 BI  5/2001    Updegrove ........................ 385/14
6,243,769 B1 6/2001    Rooney ............................ 710/56
6,285,349 B1 9/2001    Smith .............................. 345/147
6,327,642 B1 12/2001   Lee et al .......................... 711/120
6,330,205 B2 12/2001   Shimizu et al ...................... 365/230.06
6,347,055 BI  2/2002    Motomura ......................... 365/189.05
6,349,363 B2 2/2002    Cai et al ........................... 711/129
6,356,573 B1 3/2002    Jonsson et al ...................... 372/46
6,367,074 B1 4/2002    Bates et al. ........................ 717/11
6,373,777 B1 4/2002    Suzuki ............................. 365/230.03
6,381,190 B1 4/2002    Shinkai ............................ 365/230.03 --
Reads "6,631,440 B2 10/2003 Jenne et al." should read -- 6,631,440 B2 10/2002 Jenne et al. --
OTHER PUBLICATIONS, "Micron Technology, Inc. Synchronous DRAM Module 512MB/1GB (x72, ECC) 168-PIN Registered FBGA SDRAM DIMM, Micron Technology, Inc., 2002, pp. 1-23." should read -- Micron Technology, Inc. "Synchronous DRAM Module 512MB/1GB (x72, ECC) 168-PIN Registered FBGA SDRAM DIMM," Micron Technology, Inc., 2002, pp. 1-23. --

Column 3,
Line 53, reads "a need for memory module" should read -- a need for a memory module --

Column 4,
Line 41, reads "which, is typically" should read -- which is typically --

UNITED STATES PATENT AND TRADEMARK OFFICE
CERTIFICATE OF CORRECTION

PATENT NO. : 6,754,117 B2
DATED : June 22, 2004
INVENTOR(S) : Joseph M. Jeddeloh It is certified that error appears in the above-identified patent and that said Letters Patent is hereby corrected as shown below:

Column 6,
Line 16, reads "such a first in," should read -- such as a first in, --

Column 10,
Line 1, "access the memory devices" should read -- accesses the memory devices --

Column 11,
Line 34, reads "memory access device." should read -- memory access devices. --

Column 14,
Line 14, reads "memory access device." should read -- memory access devices. --

Column 15,
Line 2, reads "devices; and" should read -- devices; --
Line 8, reads "devices;" should read -- devices; and --

Signed and Sealed this

Second Day of August, 2005

JON W. DUDAS
*Director of the United States Patent and Trademark Office*